United States Patent
Spitzer et al.

(10) Patent No.: US 7,531,405 B2
(45) Date of Patent: May 12, 2009

(54) METHOD OF MANUFACTURING A DIELECTRIC LAYER AND CORRESPONDING SEMICONDUCTOR DEVICE

(75) Inventors: Andreas Spitzer, Ottobrunn (DE); Elke Erben, Dresden (DE)

(73) Assignee: Qimonds AG, Munich (DE)

( * ) Notice: Subject to any disclaimer, the term of this patent is extended or adjusted under 35 U.S.C. 154(b) by 418 days.

(21) Appl. No.: 11/067,496

(22) Filed: Feb. 28, 2005

(65) Prior Publication Data

US 2006/0192271 A1   Aug. 31, 2006

(51) Int. Cl.
H01L 21/338 (2006.01)
H01L 21/8238 (2006.01)
H01L 21/8244 (2006.01)
H01L 21/8242 (2006.01)
H01L 21/8234 (2006.01)
H01L 21/336 (2006.01)
H01L 21/8222 (2006.01)
H01L 21/20 (2006.01)
H01L 21/473 (2006.01)

(52) U.S. Cl. .............. 438/216; 438/171; 438/190; 438/201; 438/210; 438/211; 438/238; 438/240; 438/257; 438/287; 438/329; 438/381; 438/594

(58) Field of Classification Search ............ None
See application file for complete search history.

(56) References Cited

U.S. PATENT DOCUMENTS

| 4,464,701 | A | * | 8/1984 | Roberts et al. | 361/313 |
|---|---|---|---|---|---|
| 5,814,542 | A | * | 9/1998 | Nakajima | 438/250 |
| 5,923,056 | A | * | 7/1999 | Lee et al. | 257/192 |
| 6,020,024 | A | * | 2/2000 | Maiti et al. | 438/287 |
| 6,214,749 | B1 | * | 4/2001 | Watanabe et al. | 438/783 |
| 6,320,324 | B1 | * | 11/2001 | Kusunoki et al. | 315/169.3 |
| 6,787,451 | B2 | | 9/2004 | Shimamoto et al. | |
| 6,933,218 | B1 | * | 8/2005 | Lee et al. | 438/591 |
| 2002/0055270 | A1 | * | 5/2002 | Narwankar et al. | 438/776 |
| 2003/0151074 | A1 | * | 8/2003 | Zheng et al. | 257/200 |
| 2005/0023595 | A1 | * | 2/2005 | Forbes et al. | 257/314 |
| 2005/0051512 | A1 | * | 3/2005 | Lin | 216/13 |
| 2005/0062115 | A1 | * | 3/2005 | Ohtake et al. | 257/412 |
| 2005/0085058 | A1 | * | 4/2005 | Derderian et al. | 438/584 |
| 2005/0101132 | A1 | * | 5/2005 | Kim et al. | 438/687 |
| 2005/0168919 | A1 | * | 8/2005 | Welsch et al. | 361/525 |
| 2005/0269598 | A1 | * | 12/2005 | Jong | 257/200 |
| 2005/0280069 | A1 | * | 12/2005 | Mizushima et al. | 257/314 |
| 2005/0282341 | A1 | * | 12/2005 | Park et al. | 438/283 |
| 2006/0063342 | A1 | * | 3/2006 | Fujikawa et al. | 438/369 |
| 2007/0012968 | A1 | * | 1/2007 | Yoshida et al. | 257/291 |

FOREIGN PATENT DOCUMENTS

| JP | 57167669 A | | 10/1982 |
|---|---|---|---|
| JP | 11168096 A | | 6/1999 |
| JP | 2001-578160 | * | 4/2001 |

* cited by examiner

Primary Examiner—Matthew Smith
Assistant Examiner—James M Mitchell
(74) Attorney, Agent, or Firm—Eschweiler & Associates LLC

(57) ABSTRACT

A polycrystalline dielectric layer is formed wherein the dielectric layer comprises a first dielectric material containing an oxide or nitride and a second material contributing to less than 1% in weight to the dielectric layer, forming a non-conductive oxide or nitride having an enthalpy lower than the enthalpy of the first dielectric material such that a leakage current along grain boundaries of the first dielectric material is reduced.

6 Claims, 2 Drawing Sheets

METHOD OF MANUFACTURING A DIELECTRIC LAYER AND CORRESPONDING SEMICONDUCTOR DEVICE

TECHNICAL FIELD OF THE INVENTION

The invention relates to a method of manufacturing a dielectric layer and a semiconductor device, and in particular, to a method of manufacturing a dielectric layer having a highpermittivity, and to a corresponding semiconductor device.

BACKGROUND OF THE INVENTION

Materials of a high permittivity or high-k value are of special interest for manufacturing semiconductor devices like capacitors. As an example, FIG. 1 illustrates a capacitor structure in a substrate 1, made of an outer electrode 2, a dielectric layer 3 and an inner electrode 4. Most modern capacitor structures use a similar arrangement. As capacity scales having a permittivity of the dielectric layer 3 respective materials are preferably chosen from materials having a high permittivity, so-called high-k dielectrics, As further a capacity inversely scales having the thickness of the dielectric layer 3 commonly these layers 3 are made thinner than 20 nm or even thinner than 10 nm.

The high-k dielectric layers are deposited in an amorphous state upon the substrate 1 or a first electrode 2. However, it appears that these materials tend to form a polycrystalline layer due to subsequent thermal steps. Such a polycrystalline layer is schematically illustrated in FIG. 2 having crystalline grains 10 and conductive channels 11 formed along the grain boundaries. These conductive channels 11 are considered to be a cause for leakage currents from the first electrode 2 to the second electrode 4. This is especially the case when the thickness of the dielectric layer 3 and the diameter of the grains 10 are of same order. Then, conductive channels 11 may be formed by just one or two grains connecting the electrodes 2, 4 having a relatively low resistance. The conductive channels 11 reduce the resistance of the dielectric layer. Especially, the resistance of layers having a width less than 20 nm is dominated by these conductive channels.

SUMMARY OF THE INVENTION

The present invention provides a method for forming a dielectric layer in a polycrystalline state having a high permittivity without the negative effects of conductive channels caused by the grain boundaries.

In one embodiment of the present invention, a second material is applied which organizes itself as the grain boundaries of the polycrystalline material such that channels along the grain boundaries become non-conductive. One mechanism of the second material is that it saturates dangling bonds at the grain boundaries.

The present invention forms a polycrystalline dielectric layer wherein the dielectric layer comprises first dielectric material including an oxide or nitride, and a second material contributing to less than 1% in weight to the dielectric layer, forming a non-conductive oxide or nitride having an enthalpy lower than the enthalpy of the first dielectric material such that a leakage current along grain boundaries of the first dielectric material is reduced.

In another embodiment of the invention, there is a semiconductor device comprising at least one dielectric layer is provided wherein the dielectric layer comprises a first dielectric material including an oxide or nitride and a second material contributing less than 1% in weight to the dielectric layer forming a non-conductive oxide or nitride having an enthalpy lower than the enthalpy of the first dielectric material, wherein the second material is arranged at the grain boundaries of the first dielectric material such that a leakage current along grain boundaries of the first dielectric material is reduced. An advantage of the present invention is that the oxide or nitride of the second material having an enthalpy lower than the enthalpy of the first dielectric material arrange themselves in a self-organized process along the grain boundaries. Further, as the second material makes a minor contribution to the dielectric layer, the dielectric properties of the dielectric layer are dominated by the characteristics of the crystalline first dielectric material. The dielectric layer will be in most cases in the range of 10 nm or thinner, however the inventive method can be as well applied on dielectric layers having a thickness of more than 10 nm.

According to a preferred embodiment, the deposition step comprises a CVD or ALD process of the first dielectric material and the second material is inserted into a processing chamber during the CVD or ALD process. A concentration of the second material is chosen such that the contribution of the second material in the dielectric layer is below 1% in weight. This embodiment has minor modifications of the well-known ALD or CVD processes, and therefore this embodiment is compatible with standard processes for semiconductor manufacturing. It might be advantageous to apply a high-temperature step after the formation of the dielectric layer such that a self-organized arrangement of the second material along the grain boundaries by diffusion is enhanced and in order to accelerate the reaction of the second material with the oxygen or nitride atoms at the grain boundaries.

According to a preferred embodiment, a second material is deposited immediately before or after depositing the first dielectric material, and a high-temperature step is applied to the dielectric layer such that a second material diffuses to the grain boundaries of the first dielectric material.

According to a further embodiment, the first dielectric material is deposited and the second material is implanted into the first dielectric material by an ion implanting step, and afterwards in a similar fashion to the above embodiments, a high-temperature step is applied similar to the above embodiments.

The first dielectric layer may comprise aluminium oxide, and the second material may comprise silicon. A further embodiment uses aluminium nitride as the first dielectric layer and a second material silicon.

According to a preferred embodiment, the semiconductor device comprises a capacitor structure wherein a dielectric isolator between two capacitor plates is made of the dielectric layer.

BRIEF DESCRIPTION OF THE DRAWINGS

Embodiments of the present invention are illustrated in the figures and will be described in detail herein below.

The figures illustrate.

Identical reference numerals are designated to identical components or components having identical functions if not indicated otherwise in the description.

DETAILED DESCRIPTION OF THE INVENTION

Figure 1:
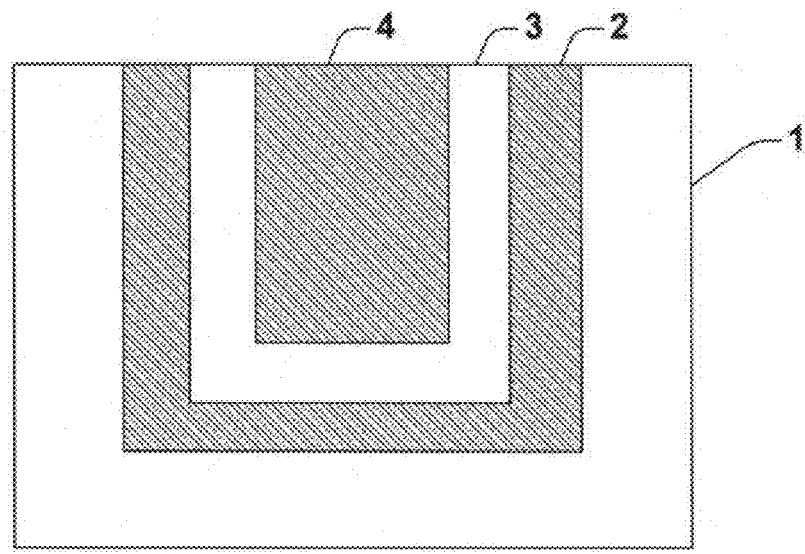
FIG. 1 a schematical cross-section of a capacitor.
Figure 2:
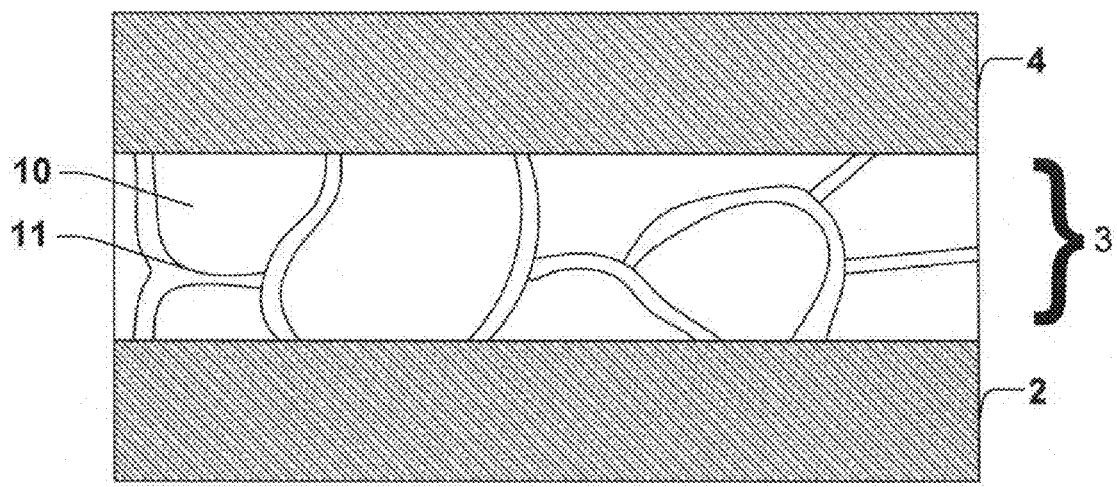
FIG. 2 a cross-section for illustrating an underlying problem of the present invention.
Figure 3:
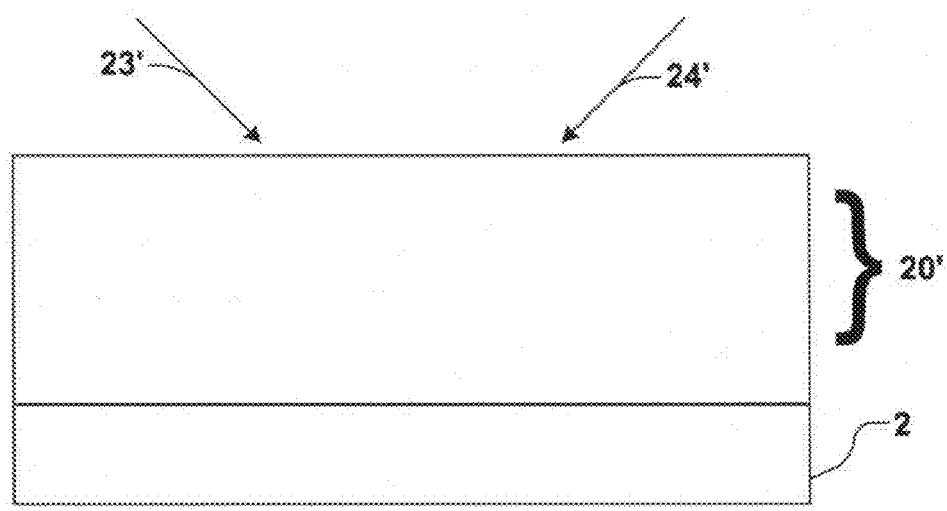
FIG. 3 a process step of a most preferred embodiment of the present invention.

FIG. 3 illustrates a process step of a preferred embodiment of the present invention. A substrate 2 is provided. A dielectric layer 20' is deposited via an ALD 20 (Atomic Layer Deposition) process. A first dielectric material 24' may be deposited with a one or two precursors. The first dielectric material is selected from a group of materials having a high permittivity (high-k dielectrics). This material may be magnesium oxide, aluminium oxide, titan oxide, tungsten oxide, tantalum oxide or other oxides chosen for high-k dielectrics. Along with the deposition of the first dielectric material 24', a second material 23' may be introduced into the same reaction chamber in small amounts such that its contribution to the dielectric layer 20' remains below 1% in weight. The second material may be transported as well by a precursor, as indicated in FIG. 3 by the flash, or simply added to the atmosphere in the reaction chamber.

Figure 4:
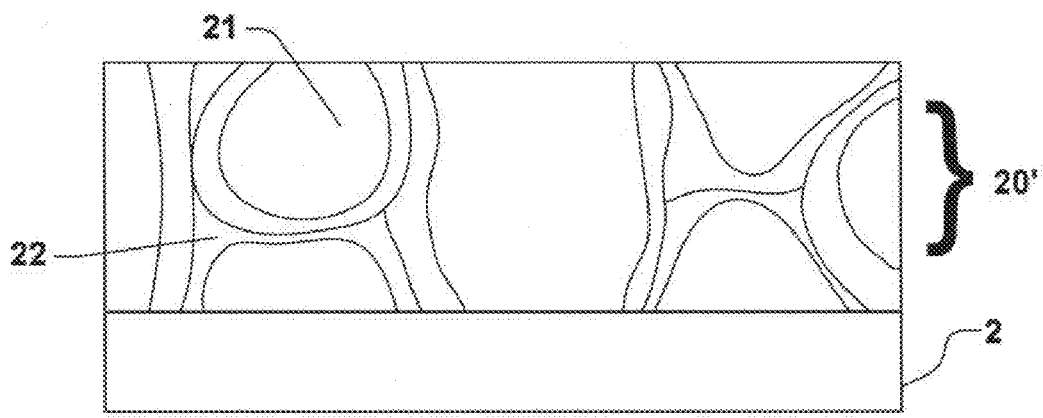
FIG. 4 a cross-section of an embodiment of the present invention.

After the deposition of the dielectric layer 20, high temperature steps are applied. These steps lead to a crystallization of the mostly amorphous layer 20' such that a dielectric layer 20 having a polycrystalline structure is formed, as illustrated in FIG. 4. Crystalline grains 21 contain predominantly the first dielectric material 24'. The atoms of the second material 23' segregate from the crystalline grains 21 to the grain boundaries by diffusion. This happens in a self-organized way as the atoms of the second material 23' do not fit well into the crystal structure of the first dielectric material 24'. Subsequent high-temperature step enhance the diffusion and a reaction of the second material of the dangling bonds of the oxygen at the grain boundaries.

The second material 23' is selected from a group of elements having a higher affinity to oxygen than the elements used in the first dielectric material 24'. In other words, the enthalpy of an oxide of the second material 23' is lower than the enthalpy of the first dielectric material 24'. A most preferred combination is silicon as the second material 23' and aluminium oxide 24' as first dielectric material. The affinity of an element to oxygen can be estimated by a bond enthalpy of an oxide of these elements. The bond enthalpy of the following elements increases in the order they are listed: magnesium, aluminium, molybdenium, titan, tungsten, yttrium, praseodymium, zirconium, cerium, tantalum, lanthanum, silicon, hafnium. Thus, hafnium has the highest affinity to oxygen, and magnesium the lowest. The bond enthalpy just allows an estimate of the affinity of the elements to oxygen, as the mean enthalpy within the molecules or crystals depends on third binding partners to the element. However, a higher affinity to oxygen goes along with a higher bond enthalpy. Accordingly, the first dielectric material may be chosen as an oxide of one of the listed materials and the second material is chosen as a material listed after the above one.

A possible mechanism why the contribution of the second material increases the resistance of polycrystalline dielectric layers shall be given herein below. At the grain boundaries, not all oxygen bonds are saturated. This may lead to oxygen vacancies forming electric states within the band gap of the first dielectric material 24. When these electrical states overlap in space, they are able to form conductive channels. These channels are considered to be the cause for the reduced isolation properties of polycrystalline dielectric materials as pointed out herein before. By introducing the second material having a high affinity to oxygen, these dangling bonds become saturated. Therefore, the amount of electrical states within the band gap due to oxygen vacancies can be reduced in conclusion, the second material 23 is preferably needed at the grain boundaries of the grains 21. Thus, just a minor contribution of less than 1% in weight needs to be added to the first dielectric material 24.

The oxide of the structure material 23 needs to be non-conductive itself.

Figure 5:
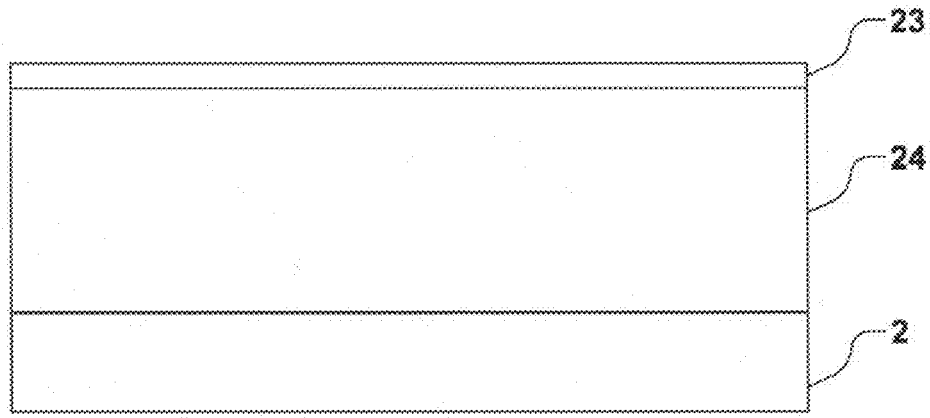
FIG. 5 a process step of an embodiment of the present invention.

FIG. 5 shows an embodiment of the present invention. On a first electrode 2, a first dielectric material 24 is deposited. The first dielectric material 24 can be deposited by an ALD (Atomic Layer Deposition) or a CVD (Chemical Vapor Deposition) process. The parameters of these deposition processes are chosen such that the dielectric material 24 is applied in a polycrystalline state.

A thin layer of a second material 23 is deposited on top of the first dielectric material 24, see FIG. 5, or the order of the deposition of the layers may be inverse, not illustrated. In latter case the second material may be silicon and the first dielectric material aluminium oxide. The two layers of the first dielectric material 24 and the second material 23 are due to subsequent high-temperature steps commonly used during the semiconductor processing. During this high-temperature step, the atoms of the second material 23 may diffuse into the first dielectric material 24 and arranging themselves at the grain boundaries as explained along with the most preferred embodiment.

Another embodiment of the present invention uses an implantation method in order to introduce the second material into a dielectric layer. Similar to the above embodiments, a high temperature step is preferably applied in order to enhance the diffusion of the second material 23 to the grain boundaries and the saturation of the dangling bonds.

The dielectric layer may be used as a dielectric layer between two electrode plates of a capacitor formed in the semiconductor devices. Further, these dielectric layers may be used in gate structures of field effect transistors.

The dielectric layer may be as well formed by a CVD (Chemical Vapor Deposition) process of the first dielectric material by an additional atmosphere containing the second material.

All argumentations herein above hold true as well for dielectrics selected of a group of nitrides by simply replacing all oxides with the respective nitrides. The first dielectric material may therefore be chosen as a nitride of the above list from magnesium to hafnium and a material having a higher bond enthalpy has to be chosen as the second material.

REFERENCE NUMERALS 1 semiconductor substrate
2 outer electrode
3 dielectric layer
4 second electrode
10 Grain
11 conductive channel
20 polycrystalline dielectric layer
20' amorphous dielectric layer
21 Grain
22 conductive channel
23, 23' second material
24, 24' dielectric material

The invention claimed is:
1. A method of manufacturing a dielectric layer, comprising:

forming a nitride of a first material, the first material chosen of the group of magnesium, aluminum, titanium, tungsten and tantalum;

forming a second material along with the first material, the second material comprising silicon and forming a nitride having an enthalpy lower than the enthalpy of the nitride of the first material, wherein the second material is deposited in an amount contributing less than one percent in weight to the dielectric layer; and applying a high temperature process to crystallize the nitride of the first material to a polycrystalline structure, wherein the second material diffuses to the grain boundaries of the polycrystalline structure in response to the high temperature process to reduce leakage currents along grain boundaries of the nitride of the first material.

2. The method according to claim 1, wherein the forming the nitride of the first material comprises a CVD or ALD process; and forming the second material comprises inserting the second material into an atmosphere of a processing chamber during the CVD or ALD process.

3. The method according to claim 1, wherein forming the second material comprises implanting the second material into the first material by an ion implanting process.

4. A semiconductor device comprising at least one dielectric layer, wherein the dielectric layer comprises:

a nitride of first material chosen from the group of magnesium, aluminum, titanium, tungsten, tantalum; the nitride of the first material being in a polycrystalline state, and a second material comprising silicon, wherein the second material contributes less than one percent in weight to the dielectric layer and comprises a non-conductive nitride having an enthalpy lower than the enthalpy of the nitride of the first material, wherein the second material is arranged at grain boundaries of the nitride of the first material such that a leakage current along the grain boundaries of the nitride of the first material is reduced.

5. The semiconductor device according to claim 4, wherein the semiconductor device comprises a capacitor structure wherein a dielectric isolator between two capacitor plates is made of said dielectric layer.

6. The semiconductor device according to claim 5, wherein the semiconductor device comprises at least one field effect transistor having a gate dielectric layer made of said dielectric layer.

* * * * *